(12) United States Patent
Hirasawa et al.

(10) Patent No.: US 7,291,905 B2
(45) Date of Patent: Nov. 6, 2007

(54) LEAD FRAME, SEMICONDUCTOR DEVICE PRODUCED BY USING THE SAME AND METHOD OF PRODUCING THE SEMICONDUCTOR DEVICE

(75) Inventors: Koki Hirasawa, Tokyo (JP); Hiroyuki Kimura, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 1115 days.

(21) Appl. No.: 09/923,394

(22) Filed: Aug. 8, 2001

(65) Prior Publication Data

US 2002/0020906 A1 Feb. 21, 2002

(30) Foreign Application Priority Data

Aug. 8, 2000 (JP) ............... 2000-239396

(51) Int. Cl.
*H01L 23/495* (2006.01)
*H01L 23/02* (2006.01)

(52) U.S. Cl. .............. 257/686; 257/666; 257/685; 257/723; 257/788; 257/790; 438/109; 438/111; 438/123; 438/125

(58) Field of Classification Search .............. 257/686, 257/666, 677, 669, 674, 529, 787, 790, 81, 257/82, 99, 670, 723, 685, 788; 435/24–26, 435/123; 385/14–16
See application file for complete search history.

(56) References Cited

U.S. PATENT DOCUMENTS

| | | | | |
|---|---|---|---|---|
| 4,797,726 | A | * | 1/1989 | Manabe .................. 357/70 |
| 5,148,243 | A | * | 9/1992 | Merrick et al. .......... 357/17 |
| 5,214,495 | A | * | 5/1993 | Kitanishi ................ 257/80 |
| 5,223,738 | A | * | 6/1993 | Okada ................... 257/666 |
| 5,235,245 | A | * | 8/1993 | Uchimura et al. ........ 313/496 |
| 5,245,198 | A | * | 9/1993 | Kusuda et al. .......... 250/551 |
| 5,309,018 | A | * | 5/1994 | Shibata ................. 257/666 |
| 5,519,596 | A | * | 5/1996 | Woolverton ............ 362/250 |
| 5,587,606 | A | * | 12/1996 | Sekiba .................. 257/670 |
| 5,647,034 | A | * | 7/1997 | Matsuda et al. ......... 385/16 |
| 5,734,197 | A | * | 3/1998 | Kelleher et al. ........ 257/666 |
| 5,763,942 | A | * | 6/1998 | Suzuki .................. 257/669 |
| 5,773,878 | A | * | 6/1998 | Lim et al. .............. 257/676 |
| 5,986,333 | A | * | 11/1999 | Nakamura ............... 257/667 |
| 6,008,528 | A | * | 12/1999 | Go et al. ............... 257/670 |
| 6,060,337 | A | * | 5/2000 | Kobachi et al. ......... 438/64 |
| 6,080,999 | A | * | 6/2000 | Mizuuchi ............... 257/81 |
| 6,194,238 | B1 | * | 2/2001 | Mizuuchi ............... 438/25 |
| 6,222,258 | B1 | * | 4/2001 | Asano et al. ........... 257/675 |
| 6,307,755 | B1 | * | 10/2001 | Williams et al. ........ 361/813 |

(Continued)

FOREIGN PATENT DOCUMENTS

DE 2 304 148 8/1974

(Continued)

*Primary Examiner*—Evan Pert
*Assistant Examiner*—Fazli Erdem
(74) *Attorney, Agent, or Firm*—Young & Thompson (57) ABSTRACT

A lead frame of the present invention includes a plurality of tie bars including tie bars each having deformable portions that protect opposite outside frames from deformation. The outside frames each are formed with positioning holes. Element loading portions to be loaded with semiconductor elements are connected to the outside frames by such tie bars. The lead frame is therefore free from deformation during lead forming while promoting the miniaturization of the semiconductor devices.

14 Claims, 12 Drawing Sheets

U.S. PATENT DOCUMENTS

| | | | |
|---|---|---|---|
| 6,377,742 B1 * | 4/2002 | Go | 385/134 |
| 6,507,035 B1 * | 1/2003 | Hasegawa et al. | 250/551 |
| 2001/0045531 A1 * | 11/2001 | Yasuda | 250/551 |

FOREIGN PATENT DOCUMENTS

| | | |
|---|---|---|
| EP | 0 206 325 | 12/1986 |
| EP | 0 213 105 | 3/1987 |
| JP | 57066655 | 4/1982 |
| JP | 59-198782 * | 11/1984 |
| JP | 61063047 | 4/1986 |
| JP | 61141165 | 6/1986 |
| JP | 05326782 | 12/1993 |
| JP | 6-85313 | 3/1994 |
| JP | 7-254728 | 10/1995 |
| JP | 9-83013 | 3/1997 |
| WO | WO98/44555 | 10/1998 |

* cited by examiner

LEAD FORMING

Figure 2:
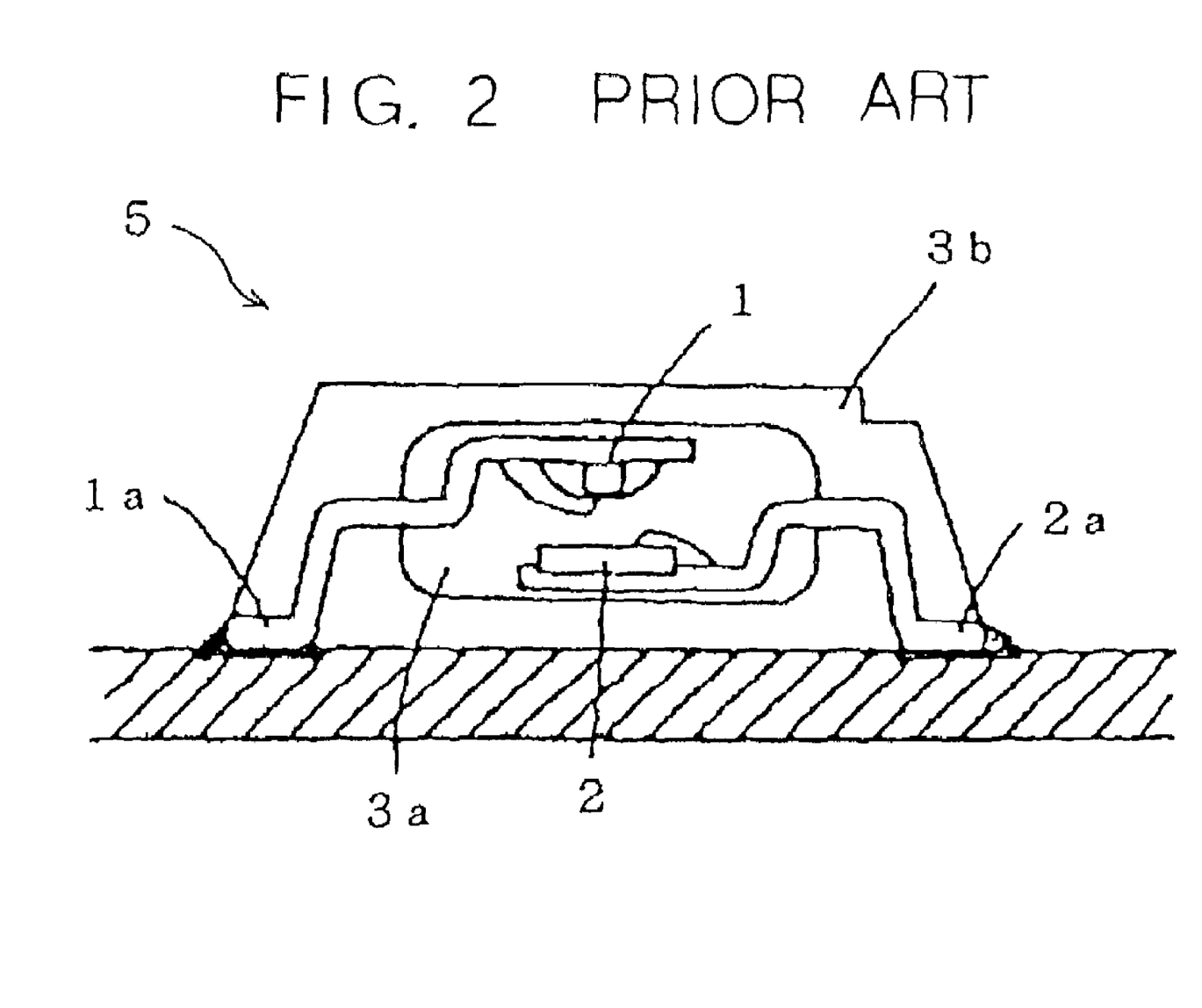
FIG. 2 is a section showing the configuration of another conventional photocoupler.

FIG. 14 and light-sensitive element 2, respectively, are formed. Thereafter, secondary seal resin seals the primary molding 3a and lead frames 1a and 2a in the form of a secondary molding 3b.

LEAD FRAME, SEMICONDUCTOR DEVICE PRODUCED BY USING THE SAME AND METHOD OF PRODUCING THE SEMICONDUCTOR DEVICE

BACKGROUND OF THE INVENTION

The present invention relates to a lead frame and more particularly to a lead frame loaded with photocoupling elements, a semiconductor device produced by using the lead frame, and a method of producing the semiconductor device.

A double sealed photocoupler belongs to a family of semiconductor devices. The double sealed photocoupler is produced by a procedure including primary sealing using light-transmitting resin and secondary sealing using light-intercepting resin. Japanese Patent Laid-Open Publication No. 9-83013, for example, discloses a double sealed photocoupler in which a lead frame for forming lead forming portions is accommodated in a secondary molding to thereby reduce the size of the photocoupler.

However, lead forming effected on a lead frame for bending the lead forming portions brings about the following problems. Portions where tie bars and opposite outside frames are connected irregularly deform. As a result, positioning holes formed in the outside frames are displaced and prevent the lead frame from being accurately positioned at a stage following the lead forming stage. Moreover, stress ascribable to lead forming remains in the individual photocoupler or product and brings about package crack or similar trouble later.

SUMMARY OF THE INVENTION

It is therefore an object of the present invention to provide a lead frame free from deformation during lead forming while reducing the size of a semiconductor device to be loaded thereon, a semiconductor device produced by using the lead frame, and a method of producing the semiconductor device.

In accordance with the present invention, a lead frame includes a tie bar to which an element loading portion to be loaded with a semiconductor element is connected by a lead forming portion. An outside frame is formed with positioning holes. The tie bar is connected to the outside frame. A deformable portion is included in the tie bar for preventing the outside frame from deforming.

Also, in accordance with the present invention, in a semiconductor device including a pair of element loading portions loaded with semiconductor elements positioned one above the other and seal resin sealing the pair of element loading portions, leads connected to a respective semiconductor element being exposed on said seal resin, only one of said pair of element loading portions is bent upward relative to said leads.

Further, in accordance with the present invention, a method of producing a semiconductor device by using a frame includes a lead forming step of bending lead forming portions after primary sealing using light-transmitting resin, and a sealing step of sealing deformable portions included in a lead frame after the lead forming step.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1A:
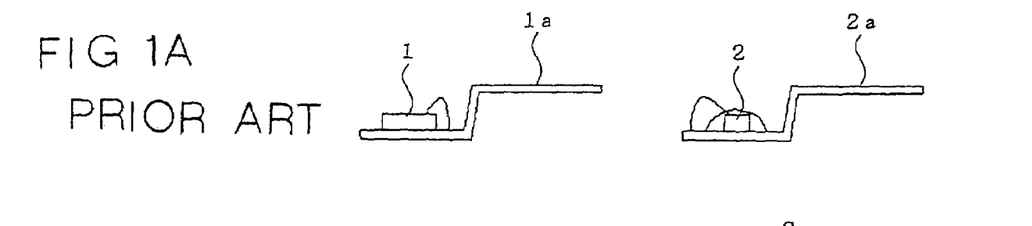
FIGS. 1A through 1E are sections demonstrating a conventional procedure for producing a double sealed photocoupler.
Figure 1B:
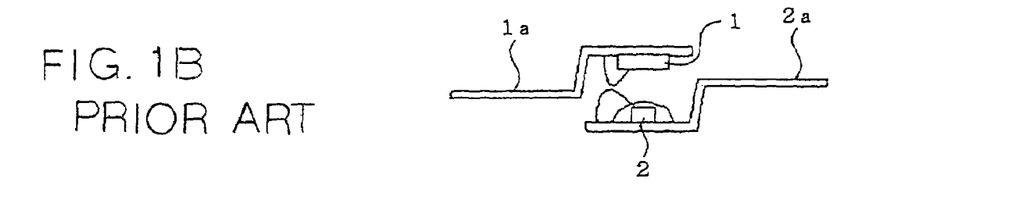

To better understand the present invention, reference will be made to a conventional procedure for producing a double sealed photocoupler, shown in FIGS. 1A through 1E. While the production of a photocoupler is executed on a lead frame, FIGS. 1A through 1E do not show the entire lead frame. As shown, a lead frame 1a is depressed and loaded with a light emitting element 1 while a lead frame 2a is also depressed and loaded with a light-sensitive element 2. The lead frames 1a and 2a are paired in the position shown in FIG. 1A. The lead frames 1a and 2a are then positioned one above the other such that the light emitting element 1 and light-sensitive element 2 face each other, as shown in FIG. 1B.

Figure 1C:
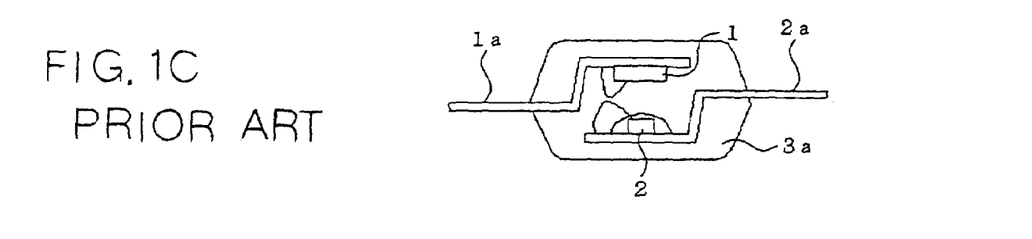
Figure 1D:
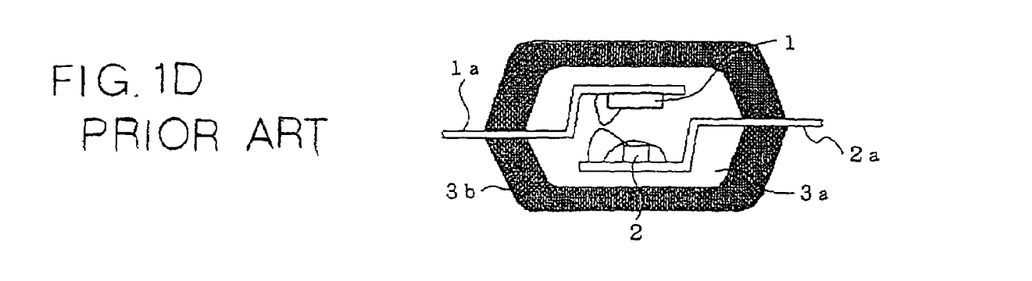
Figure 1E:
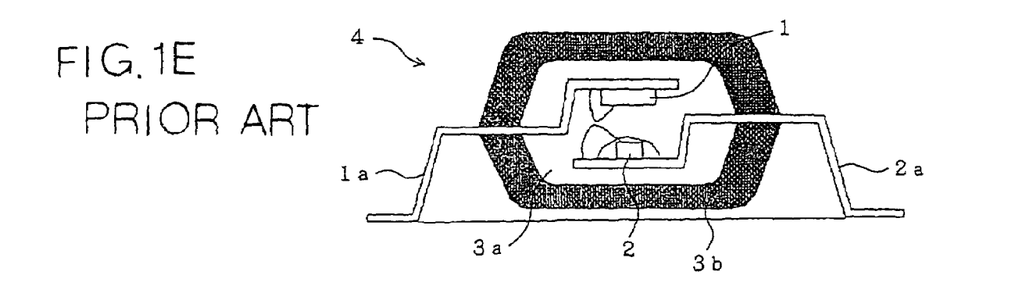

Subsequently, as shown in FIG. 1C, light transmitting, primary seal resin 3a seals the light emitting element 1 and light-sensitive element 2 to thereby secure an optical path. More specifically, the primary seal resin 3a is configured as a rhombic cube. The lead frames 1a and 2a each protrude from a particular apex of the rhombic cube. As shown in FIG. 1D, light intercepting, secondary seal resin 3b seals the primary seal resin 3a. Finally, as shown in FIG. 1E, the lead frames 1a and 2a are formed for mounting, thereby completing a photocoupler 4.

FIG. 2 shows another conventional photocoupler. As shown, the photocoupler, labeled 5, includes a primary molding 3a sealed by light transmitting, primary seal resin. Subsequently, the lead frames 1a and 2a loaded with the light emiting element 1 and light-sensitive element 2, respectively, are formed. Thereafter, secondary seal resin seals the primary molding 3a and lead frames 1a and 2a in the form of a secondary molding 3b.

Lead forming is effected with the photocoupler 4 after secondary sealing or effected with the photocoupler 5 after primary sealing, as stated above. A specific lead forming process executed after primary sealing will be described hereinafter.

Figure 3A:
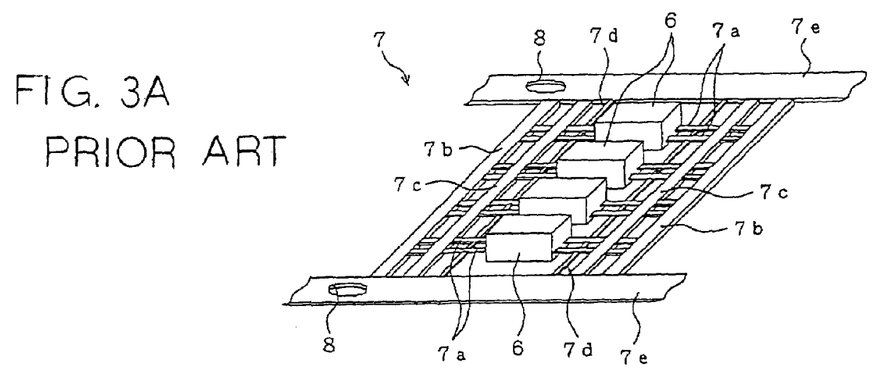
FIGS. 3A through 3C are isometric views for describing lead forming included in the conventional procedure for producing a photocoupler.
Figure 3B:
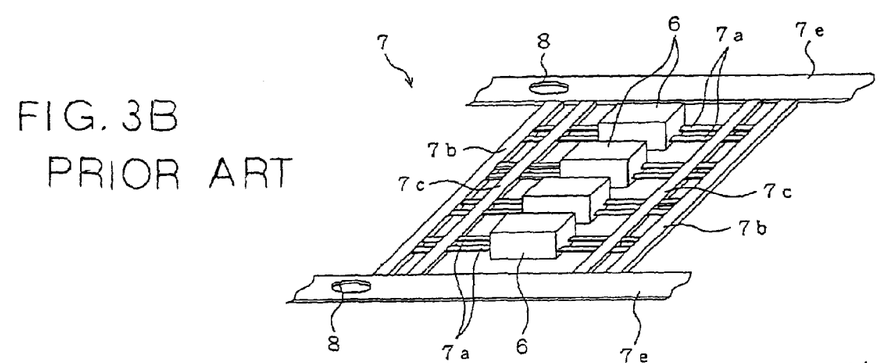
Figure 3C:
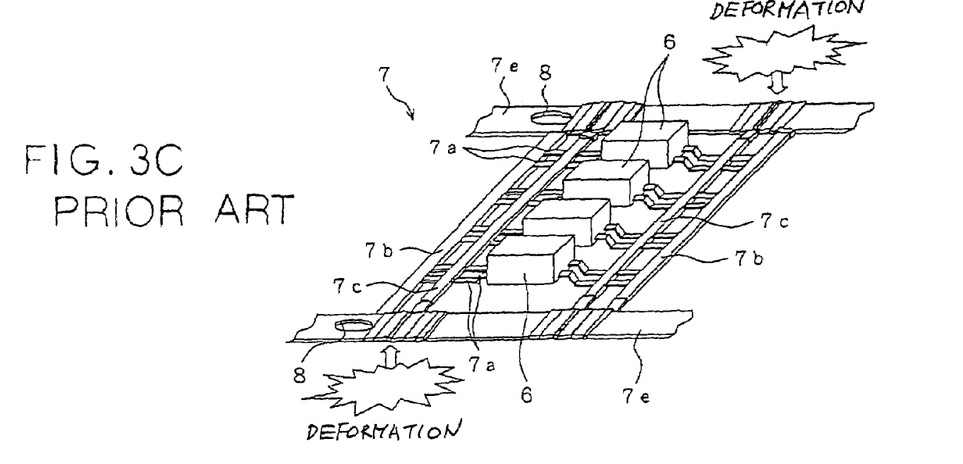

FIGS. 3A through 3C demonstrate a conventional lead forming process applicable to a photocoupler. As shown, a plurality of (four in the specific procedure) photocouplers 6 each have two lead (terminal) forming portions 7a protruding from each of opposite ends. Each photocoupler 6 is connected to a lead frame 7 via the respective lead forming portions 7a. As shown in FIG. 3A, each lead forming portion 7a is connected to a first and a second tie bar 7b and 7c and an inner tie bar 7d. The tie bars 7b through 7d extend between two parallel, outside frames 7e.

Figure 7A:
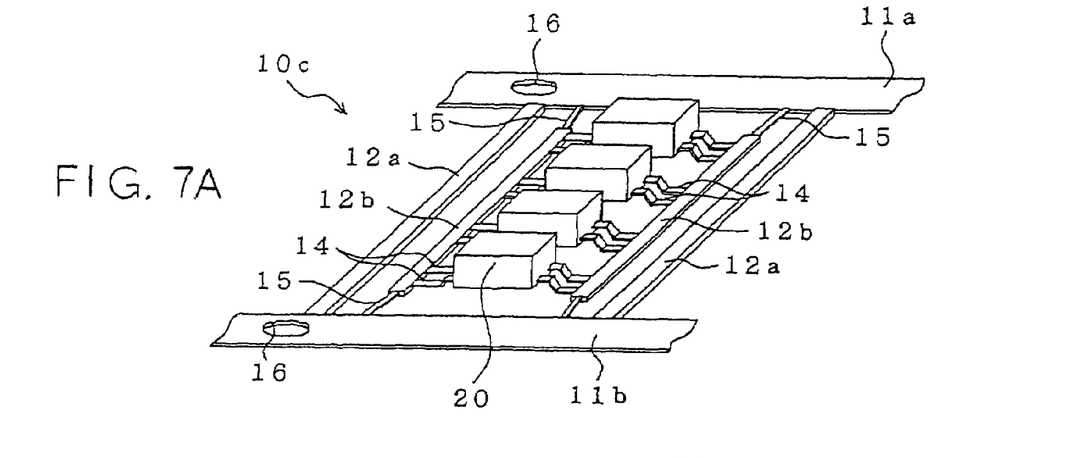

More specifically, as shown in FIG. 7A, three tie bars 7b through 7d are arranged in parallel at each of opposite sides of the array of photocouplers 6 and extend substantially perpendicularly to the lead forming portions 7a. The outside frames 7e each are formed with holes 8 for positioning the lead frame 7.

The lead forming process begins after the primary sealing shown in FIG. 3A. First, as shown in FIG. 3B, the inner tie bars 7d are cut off while the first and second tie bars 7b and 7c are left. Subsequently, as shown in FIG. 3C, the lead forming portions 7a are bent between the individual photocoupler 6 and the first tie bars 7b (lead forming). Particularly, in the structure shown in FIG. 2, lead forming must be effected after the primary sealing in order to raise the primary molding 3a, which accommodates the light emitting element 1 and light-sensitive element 2.

The lead forming process described above has the following problems. When the lead forming portions 7a of the photocouplers 6 are bent on the lead frame 7, portions of the lead frame 7 where the tie bars 7b and 7c and outside frames 7e are connected irregularly deform, as shown in FIG. 3C. This is because the lead forming portions 7a bent by lead forming pull the tie bars 7b and 7c inward. As a result, the positioning holes 8 formed in the frames 7e are displaced and prevent the lead frame 7 from being accurately positioned at a stage following the lead forming stage. Moreover, stress ascribable to lead forming remains in the individual photocoupler 6 and brings about package crack or similar trouble later.

Particularly, in the structure shown in FIG. 2, it is necessary to bend the leads before secondary sealing. Stress ascribable to the bending of the leads causes even the lead frame 7 loaded with photocouplers to deform by 0.2 mm or so. Such deformation disturbs the positional relation between the photocouplers and the positioning holes 8. This also obstructs accurate positioning after secondary sealing and therefor the production of photocouplers.

More specifically, lead forming is effected after the positioning holes 8 have been formed in the lead frame 7. Therefore, when the leads are bent, stress act on the holes 8 and cause them to deform. As a result, the holes 8 are displaced. The holes 8 are used to position the lead frame 7 before and after lead forming, and each has a relative positional relation with the individual photocoupler 6. The holes 8 are positioned at substantially the same interval. It is therefore important to maintain the accurate positional relation or distance between the holes 8 and the individual photocoupler 6. All stages on a production line rely on positioning based on the holes 8.

Figure 4A:
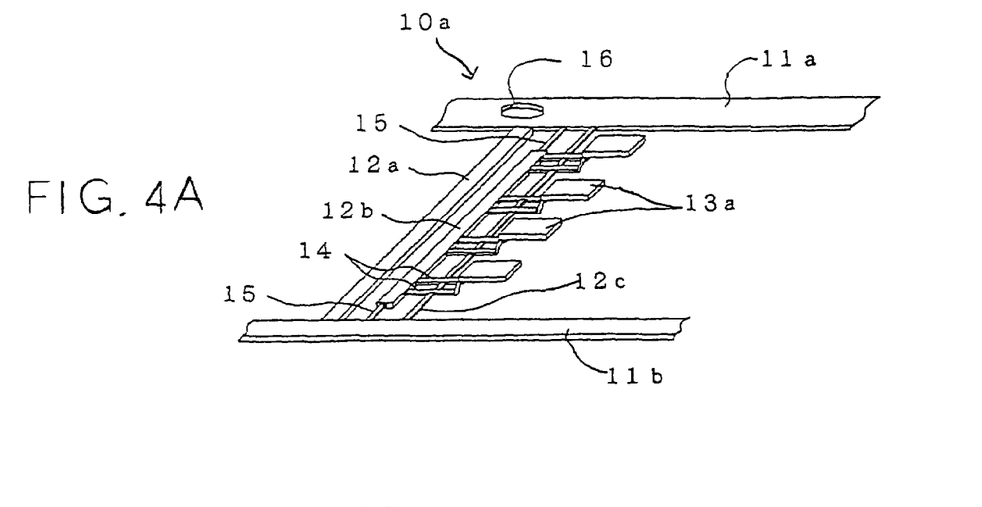
FIGS. 4A through 4C are isometric views showing a lead frame embodying the present invention.
Figure 4B:
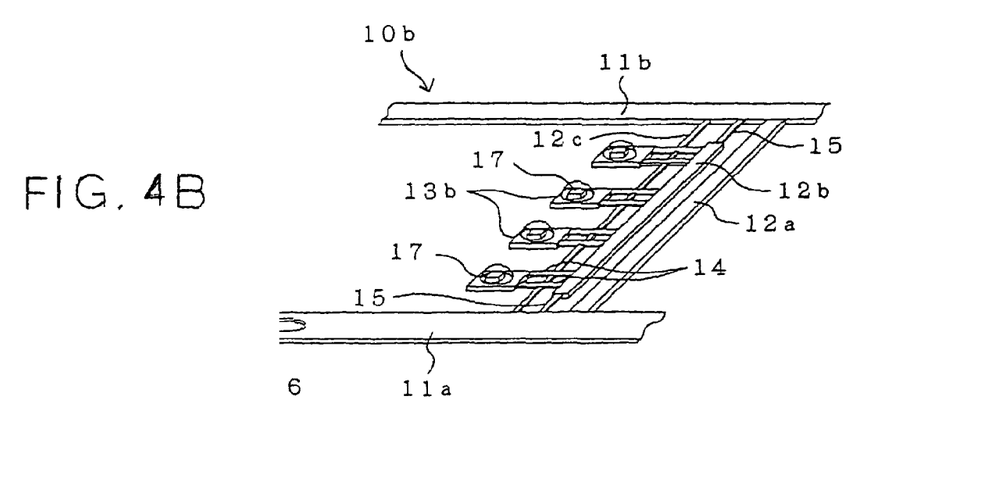
Figure 4C:
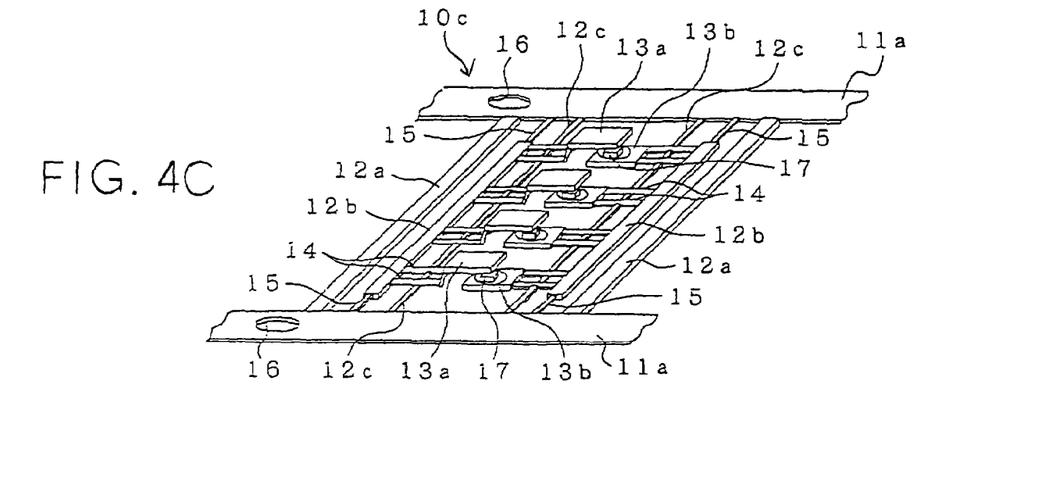

Referring to FIGS. 4A through 4C, a lead frame embodying the present invention will be described. FIGS. 4A and 4B show a lead frame 10a assigned to the light emission side and a lead frame 10b assigned to the light receiving side, respectively. FIG. 4C shows a frame for forming photocouplers, which are a specific form of semiconductor devices. The lead frames 10a and 10b are respectively loaded with light emitting elements and light-sensitive elements, which will be described specifically later. The light emitting elements and light-sensitive elements may be implemented as LEDs (Light Emitting Elements) and phototransistors, respectively. The lead frame 10a is reversed in orientation and superposed on the lead frame 10b, so that the light emitting elements and light-sensitive elements face each other.

As shown in FIG. 4A, the lead frame 10a includes a pair of parallel, outside frames 11a and 11b, a first and a second tie bar 12a and 12b, an inner tie bar 12c for reinforcement, and a plurality of (four in the illustrative embodiment) element loading portions 13a. The tie bars 12a through 12c extend between the opposite frames 11a and 11b. Each element loading portion 13a is connected to the inner tie bar 12c and second tie bar 12b by two depressed, lead (terminal) forming portions 14. A light-sensitive element, not shown, is loaded on the rear surface of each element loading portion 13a face down and connected to preselected positions by metal wires although not shown specifically.

As shown in FIG. 4B, the lead frame 10b includes element loading portions 13b connected to an inner tie bar 12c and a second tie bar 12b by two lead forming portions 14. A light emitting element 17 is loaded on each element loading portion 13b and connected to preselected positions by metal wires although not shown specifically. The light emitting element 17 is coated with protection resin.

In FIGS. 4A and 4B, the first and second tie bars 12a and 12b have substantially the same width that is greater than the width of the rod-like inner tie bar 12c. The second tie bars 12b each are connected to the frames 11a and 11b by deformable portions 15 at opposite ends thereof. The deformable portions 15 are implemented as rods having substantially the same diameter as the inner tie bars 12c, and each easily deforms at least in the direction parallel to the frames 11a and 11b. For example, each deformable portion 15 has a length one time or more greater than a width or has a width of about 0.3 mm, in which case the lead frame will be about 0.2 mm thick or less.

Holes 16 for positioning the lead frame 10a is formed in one outside frame 11a. The frames 11a and 11b are positioned at opposite sides of the array of element loading portions 13a. The first and second tie bars 12a and 12b and inner tie bar 12c are arranged in parallel at each of opposite sides of the element loading portions 13a and extend substantially perpendicularly to the lead forming portions 14. The lead forming portions 14 each are connected to the associated inner tie bar 12c.

The lead frame 10b is opposite in position to the lead frame 10a by 180 degrees in the direction of rotation. The element loading portions 13b of the lead frame 10b facing the element loading portions 13a are not depressed. The holes 16 of the lead frame 10b align with the holes 16 of the lead frame 10a. The lead frame 10b is therefore identical in configuration with the lead frame 10a in that it includes a pair of frames outside 11a and 11b, first and second tie bars 12a and 12b, and inner tie bar 12c. As shown in FIG. 4B, light emitting elements 17 each are loaded on the front surface of a particular element loading portion 13b face up while facing, but not contacting, one of the light-sensitive elements loaded on the element loading portions 13a.

As shown in FIG. 4C, the frame 10c for producing semiconductor devices is prepared by laying the lead frame 10a over the lead frame 10b and welding or otherwise connecting them together. At this instant, the element loading portions 13a overlie the element loading portions 13b. The holes 16 of the lead frames 10a and 10b are exposed to the outside. The frames 11a and 11b are joined together. In this manner, in the frame 10c, only the lead frame 10a has the element loading portions 13a stepped relative to the associated lead forming portions 14.

Figure 5A:
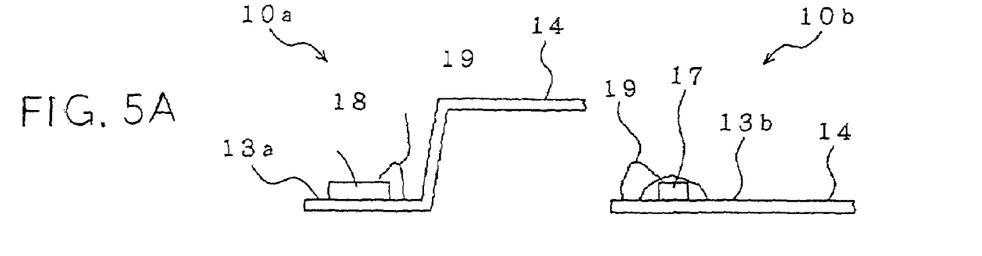
FIGS. 5A through 5E, 6A and 6B and 7A through 7C are views demonstrating a procedure for producing a semiconductor device by using the lead frame of the illustrative embodiment.
Figure 5B:
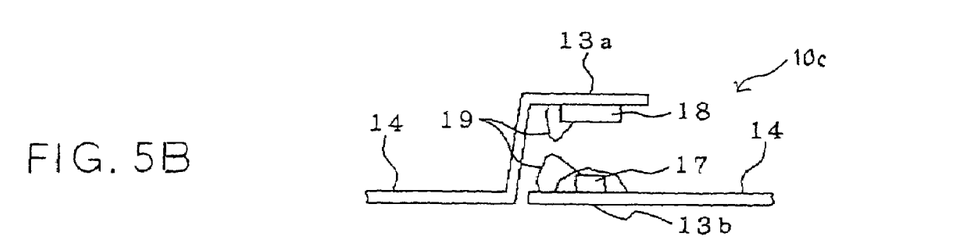

With the frame 10c, it is possible to produce an optical MOS (Metal Oxide Semiconductor) or similar photocoupler that optically couple a light emitting side and a light-sensitive side. Reference will be made to FIGS. 5A through 5E, 6A, 6B and 7A through 7C for describing a procedure for producing such a photocoupler. First, as shown in FIG. 5A, the lead frame 10a having the element loading portions 13a loaded with the light-sensitive elements 18, FIG. 4A, and the lead frame 10b having the element loading portions 13b loaded with the light emitting elements 17, FIG. 4B, are prepared. As shown in FIG. 5B, the lead frames 10a and 10b are combined such that the light emitting elements 18 and light-sensitive elements face each other, but do not contact each other, thereby constituting the frame 10c, FIG. 4C.

Each light-sensitive element 18 is bonded to the respective element loading portion 13a by wires 19. Each light emitting element 17 is precoated with, e.g., transparent silicone resin and then bonded to the respective element loading portion 13b by wires 19.

Figure 5C:
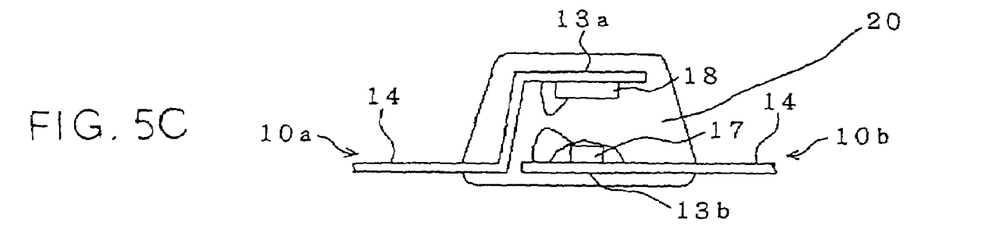
Figure 6A:
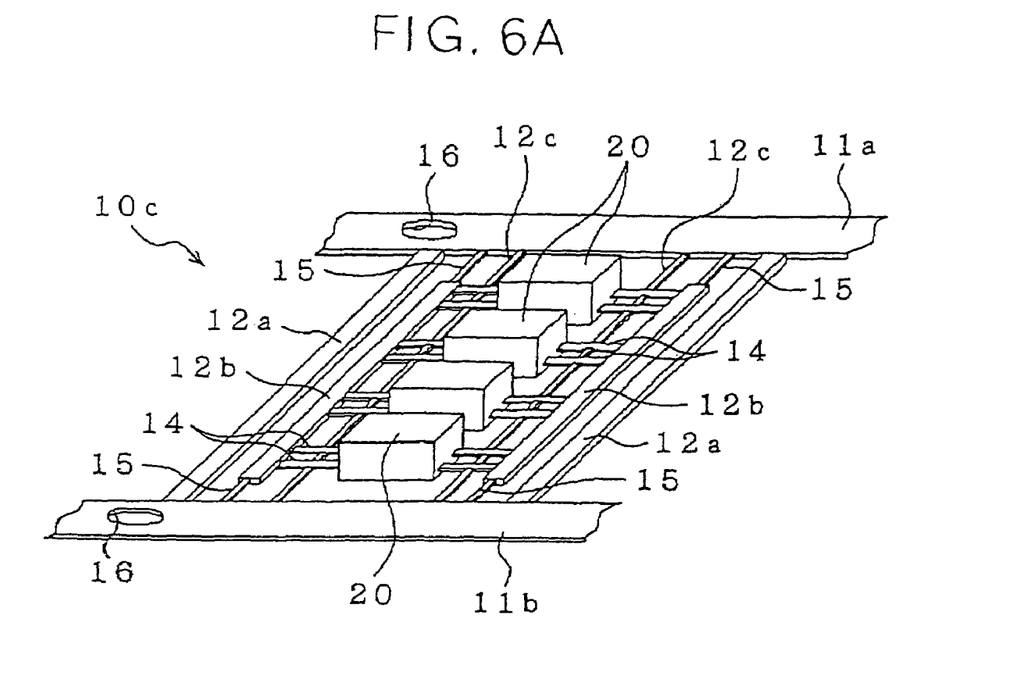
Figure 6B:
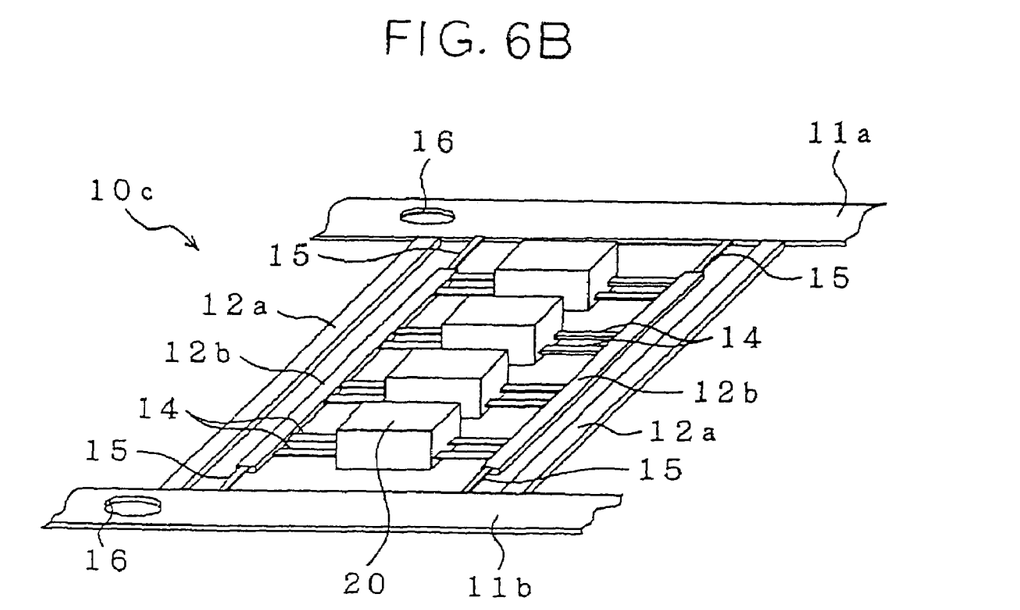

Subsequently, as shown in FIGS. 5C and 6A, each light emitting element 17 and associated light-sensitive element 18 of the frame 10c are sealed by light transmitting, primary seal resin 20 in order to secure an optical path. The seal resin 20 is configured as a trapezoidal cube. The lead forming portions 14 protrude from the portions of opposite slants of the trapezoidal cube close to the bottom. After the primary sealing, the inner tie bars 12c are cut off while the first and second tie bars 12a and 12b are left. As a result, the seal resin 20 is connected to each second tie bar 12b by two lead forming portions 14 while each tie bar 12b is connected to the frame 11a or 11b via the deformable portions 15. Stated another way, as shown in FIG. 6B, the seal resin 20 is connected to the frames 11a and 11b only by the deformable portions 15, which are easily deformable in the direction parallel to the frames 11a and 11b like, e.g., hanging pins.

Figure 5D:
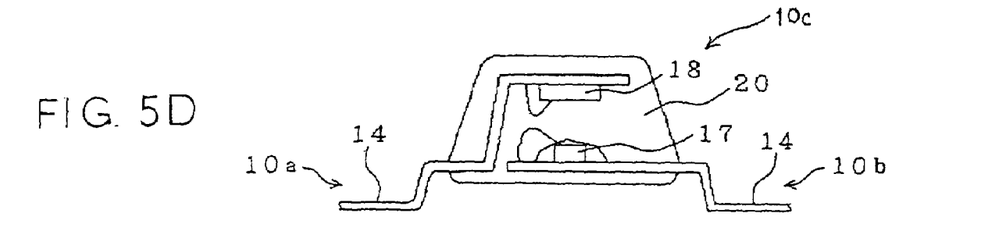

As shown in FIGS. 5D and 7A, the lead forming portions 14 are bent between the primary seal resin 20 and the second tie bars 12b (inner lead forming) in order to raise the seal resin 20. More specifically, the lead forming portions 14 are bent while being crushed and thereby locally thinned and extended.

Figure 5E:
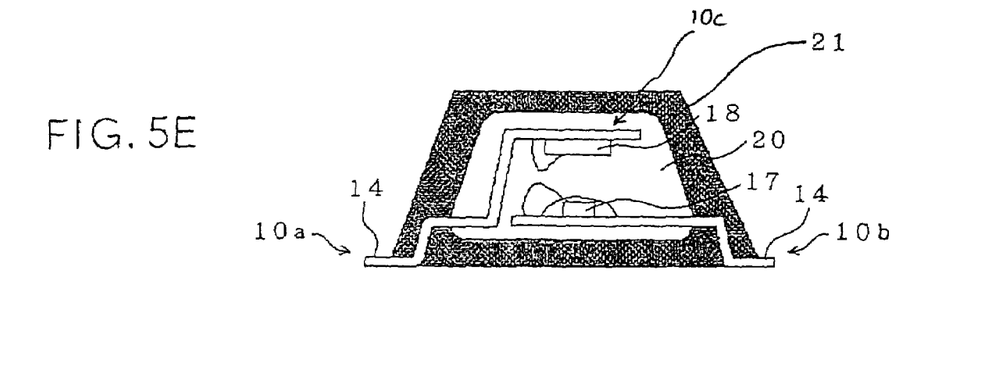
Figure 7B:
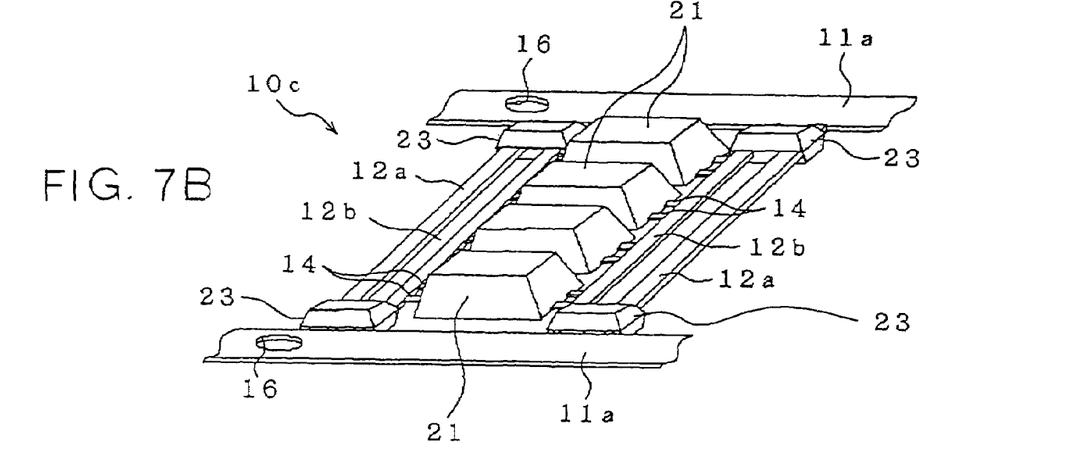

As shown in FIGS. 5E and 7B, an optical coupling device to be produced by using the frame 10c has two lead forming portions 14 accommodated in secondary seal resin 21, as will be described hereinafter. It is therefore necessary to execute lead forming after the primary sealing in order to raise the primary seal resin 20. The lead forming forms a step substantially corresponding to the thickness of the bottom of the secondary seal resin 21.

Figure 8:
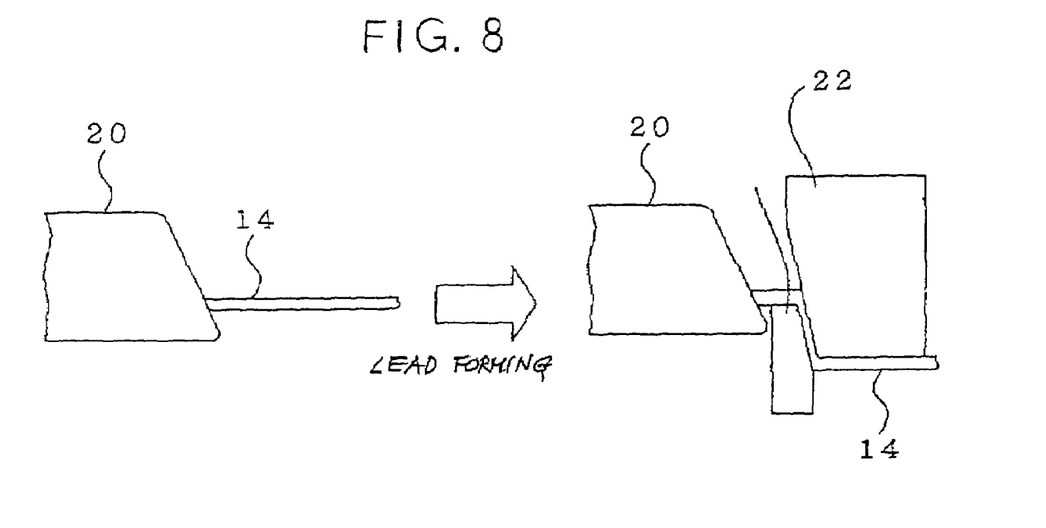
FIG. 8 is a section for describing lead forming unique to the illustrative embodiment.

The lead forming step that bends the lead forming portions 14 while crushing them will be described specifically with reference to FIG. 8. Assume the step in which after the cutting of the inner tie bars 12c following the primary sealing, each primary seal resin 20 and frames 11a and 11b are supported only by the deformable portions 15. In this condition, an upper and a lower mold 22 sandwich each lead forming portion (inner lead) 14 so as to press it downward while crushing it. Consequently, part of the lead forming portion 14 crushed and bent is extended to a thickness that is substantially three-fifths of the original thickness of the lead forming portion 14. The thin, extended part absorbs the distance over which the lead forming portion 14 is pulled during deformation, thereby reducing deformation. This successfully prevents lead forming from influencing the frame 10c. Experiments showed that for a designed amount of deformation of about 0.223 mm, the actual amount of deformation was about 0.07 mm, i.e., about one-third of the designed amount.

The deformation of each lead forming portion 14 pulls the second tie bar 12b inward toward the primary seal resin 20 during the above lead forming. However, the deformable portion 15 deforms and surely, sufficiently absorbs the force, which pulls the tie bar 12b, in combination with the crushing and bending operation, as shown in FIG. 7A. More specifically, the deformable portion 15 is configured to absorb stress acting on the tie bar 12b, which is crushed and bent, by deforming itself in the direction parallel to the frames 11a and 11b. The tie bar 12b and frames 11a and 11b are therefore free from deformation described with reference to 3C and prevent the holes 16 of the frames 11a and 11b from being displaced due to irregular deformation.

As shown in FIGS. 5E and 7B, after the lead forming described above, the light intercepting, secondary seal resin 21 seals the primary seal resin 20 in order to shield extraneous light. At the same time, the secondary seal resin 21 seals the deformable portions 15 (four in FIG. 7B) to thereby form reinforcing portions 23 for reinforcing the portions 15. The reinforcing portions 23 constitute dummy packages not containing any product.

Figure 9:
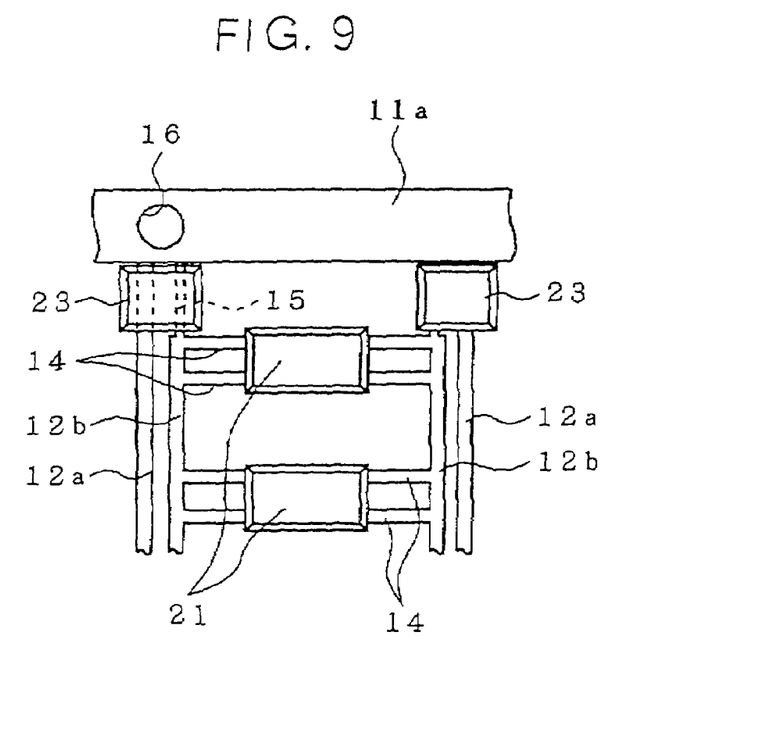
FIG. 9 is a plan view showing reinforcing portions also unique to the illustrative embodiment.

FIG. 9 shows how the reinforcing portions 23 are formed more specifically. As shown, each reinforcing portion 23 extends over the associated first and second tie bars 12a and 12b while sandwiching them from opposite sides. The reinforcing portion 23 covers not only the deformable portion 15 connecting the frame 11a or 11b and second tie bar 12b, but also the portion of the first tie bar 12a connected to the frame 11a or 11b.

Figure 7C:
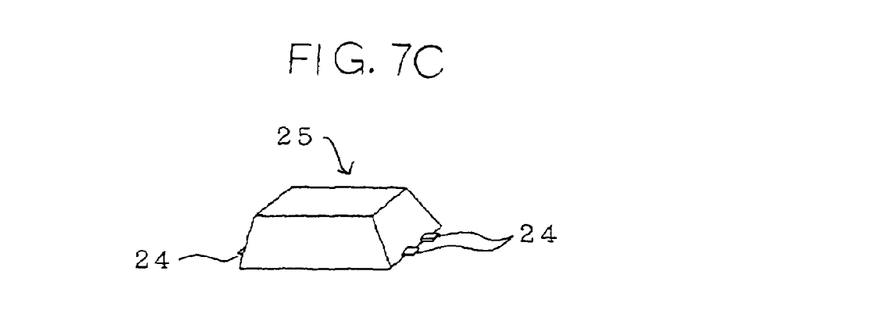

Subsequently, deburring is executed with the double sealed product portions or package portion by using, e.g., a water jet. After deburring, the leads are plated, and then the lead forming portions 14 of the individual package are cut to a necessary length. Finally, as shown in FIG. 7C, the package is removed from the frame 10c to thereby complete a photocoupler 25 for planar mounting. The leads 24 of the photocoupler 25 are positioned at the bottom of the package sealed by the secondary seal resin 21 or the extension thereof.

During deburring, a downward force acts on the product portions sealed by the secondary seal resin 21. However, the deformable portions connected to the second tie bars 12b and frames 11a and 11b are reinforced by the reinforcing portions 23 and therefore prevent the product portions from being deformed downward.

Figure 10:
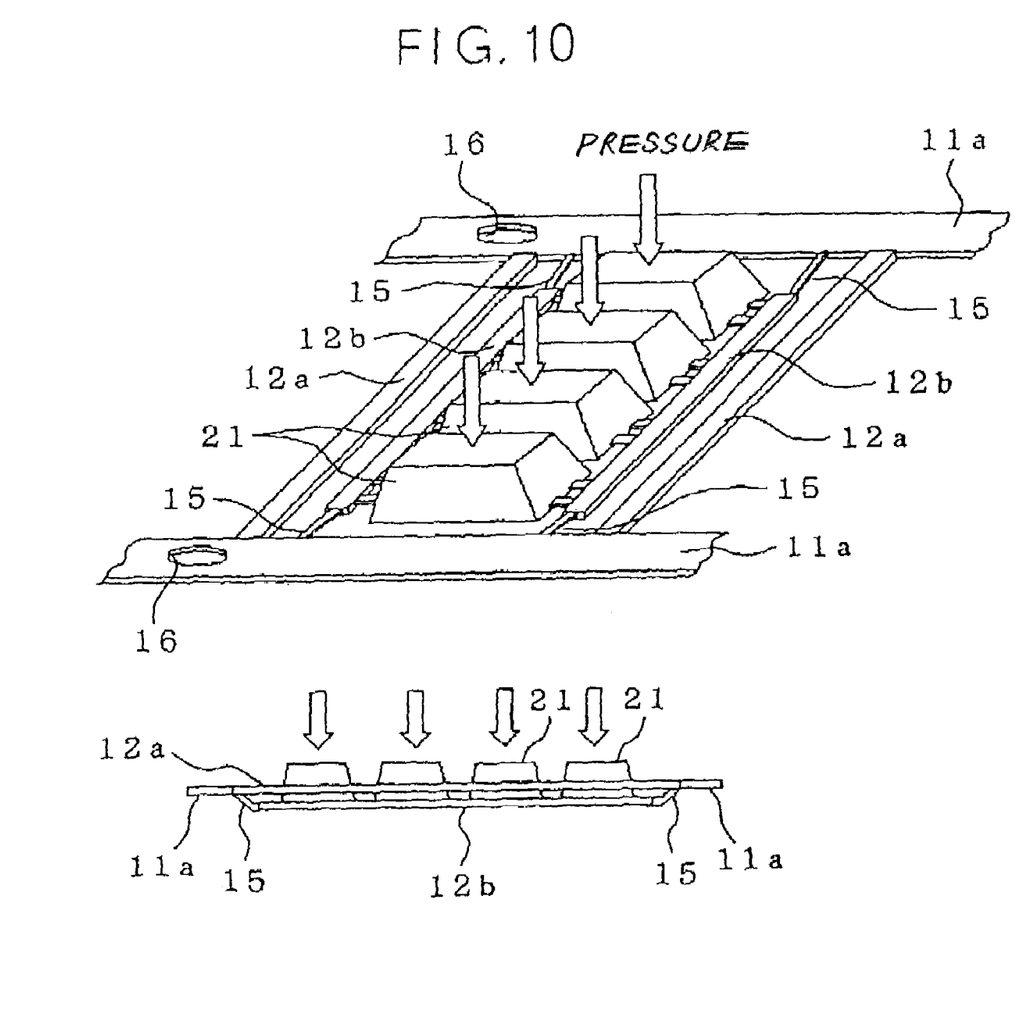
FIG. 10 is an isometric view for describing the influence of deburring.

The influence of deburring will be described with reference to FIG. 10. As shown, when a downward pressure acts on the individual product portion sealed by the secondary seal resin 21, the product portion deforms downward together with the second tie bars 12b because it is supported by the frames 11a and 11b via the deformable portions 15. More specifically, the product portions are connected to the frames 11a and 11b by the deformable portions 15 and therefore easily displaced. This is particularly true when the product portions are cleaned by a water jet before plating. However, the reinforcing portions 23 reinforcing the deformable portions 15 prevent the portions 15 from deforming, i.e., prevent the product portions from deforming via the second tie bars 12b that include the portions 15.

Figure 11:
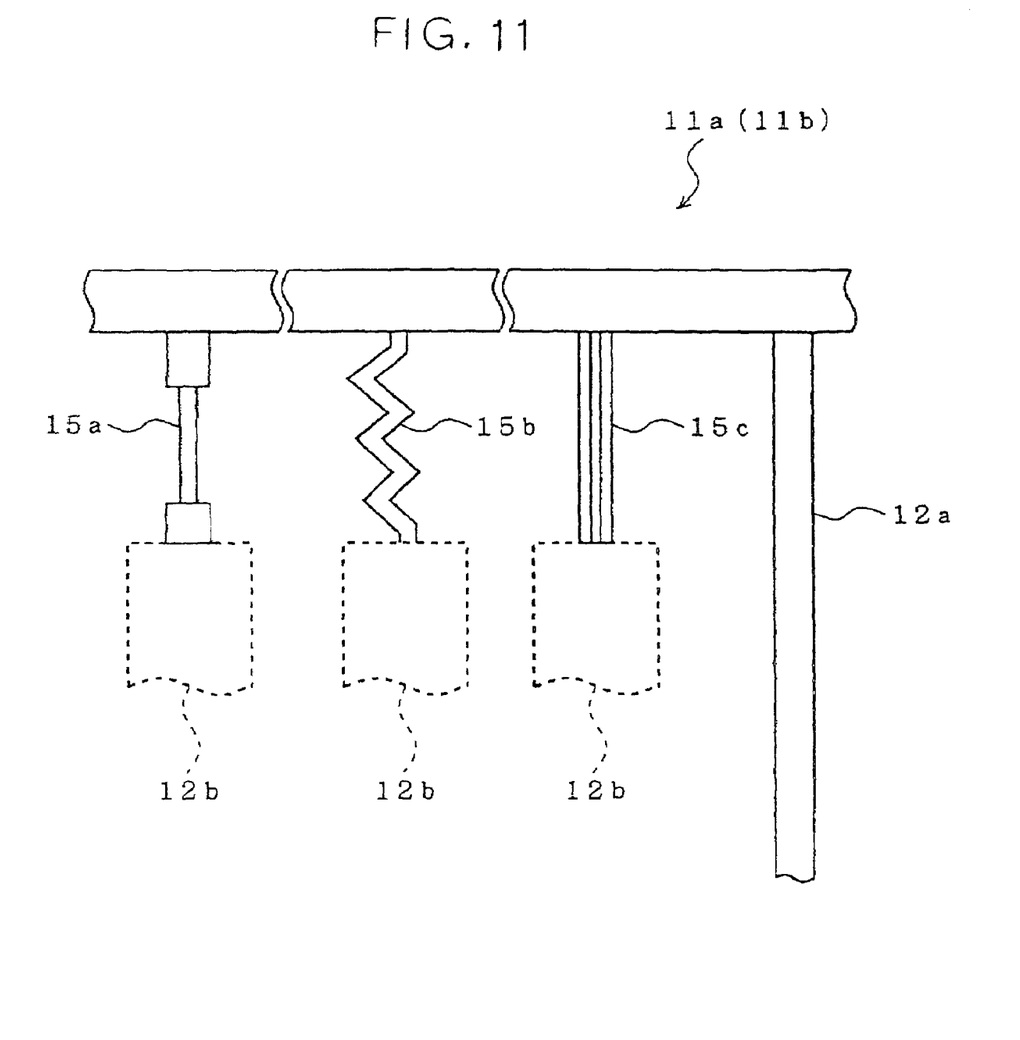
FIG. 11 is a view showing another specific configurations of a deformable portion included in the illustrative embodiment.

FIG. 11 shows specific configurations of each deformable portion 15. In the illustrative embodiment, the deformable portion 15 is implemented as a handing pin, as stated earlier. As shown in FIG. 11, the deformable portion 15 may be replaced with a deformable portion 15a larger in diameter at opposite end portions than at the intermediate portion or a deformable portion 15b bent in the form of narrow steps. Further, use may be made of a deformable portion 15c consisting of a plurality of (e.g. two) pieces. The crux is that the deformable portion be easily deformable in the direction parallel to the frames 11a and 11b, absorbing a force that pulls the second tie bars 12b inward toward the element loading portions.

Figure 12A:
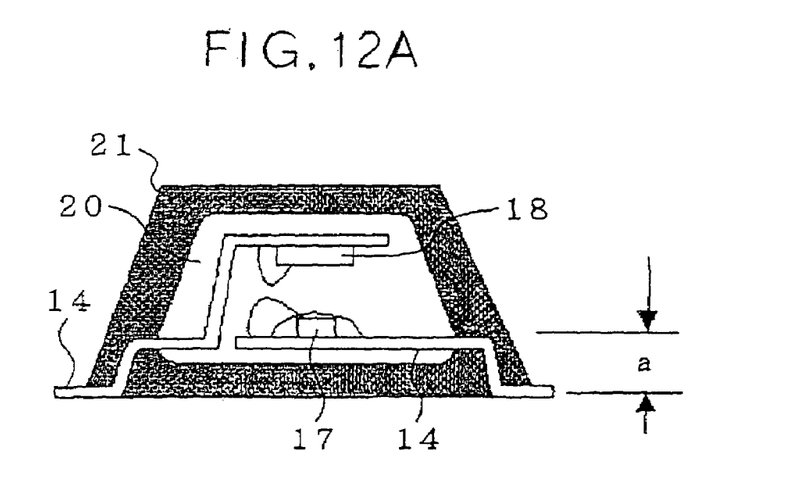
FIGS. 12A and 12B and 13 are sections for describing a configuration unique to the illustrative embodiment in which only one of two lead frames is depressed.
Figure 12B:
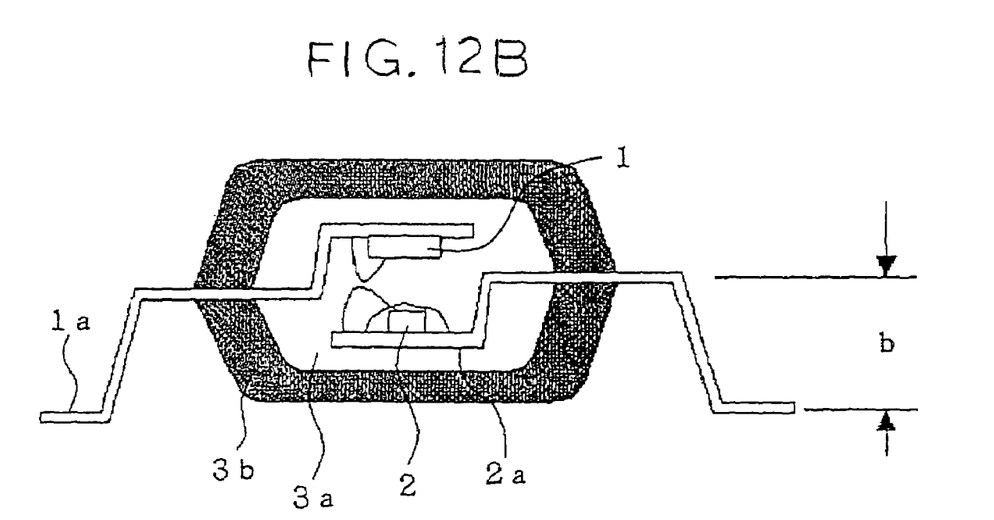

FIGS. 12A and 12B show the structure of the frame 10c in which the lead frame 10a is depressed while the lead frame 10b is not depressed. As shown in FIG. 12A, one of the frames or lead forming portions 14 is depressed while the other is left flat. By contrast, as shown in FIG. 12B, a conventional structure has both frames 1a and 1b, which are respectively assigned to the light emission side and light receiving side, depressed by substantially the same amount.

As FIG. 12A indicates, in the illustrative embodiment, only one of the frames 10a and 10b is depressed deeply enough to allow the other frame to remain flat. Moreover, in FIG. 12A, the product portion is raised, or shifted, by an amount a in order to guarantee the thickness of the secondary seal resin. The amount of shift a is smaller than the amount of shift b required of the conventional product portion shown in FIG. 12B. This not only reduces the deformation of the frames 10c ascribable to lead forming, but also promotes easy processing of the frame 10c.

Figure 13:
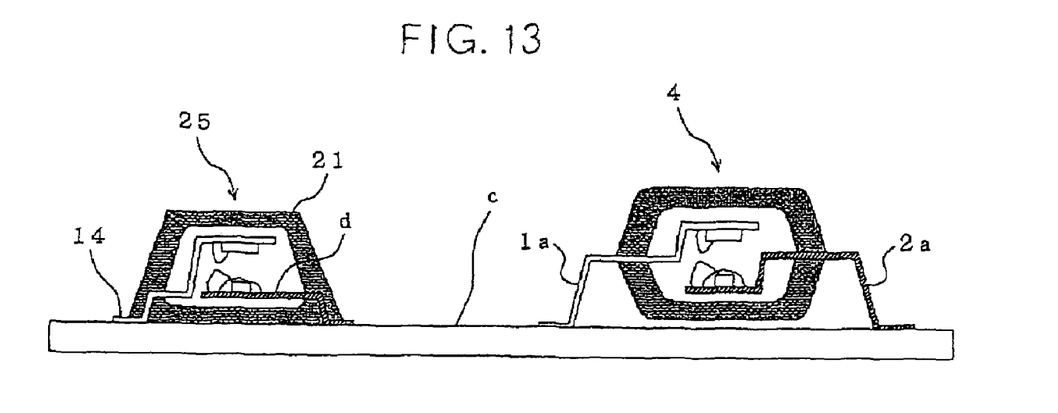

As shown in FIG. 13, in the photocoupler having the structure described above, only the light emitting element generate heat during operation. It is therefore important to release the heat for enhancing the reliability of the semiconductor device. Generally, most of the heat generated by the light emitting element is propagated through the lead frame (13b), as indicated by hatching in FIG. 13. Therefore, if the distance between the light emitting element and the mounting surface c of a circuit board is reduced, then the heat can be efficiently released to the circuit board.

More specifically, in the photocoupler 25 of the illustrative embodiment, FIG. 7C, the leads or lead forming portions 14 are accommodated in the secondary seal resin 21 while the terminals are exposed at the bottom of the seal resin 21. In this configuration, a distance d between the light emitting element and the mounting surface c (heat path d hereinafter) is shorter than the conventional distance. Further, the heat path of the photocoupler 25 is shorter than the heat path of another conventional configuration shown in FIG. 2. The illustrative embodiment therefore reduces thermal resistance, i.e., the temperature elevation of a chip itself relative to power consumption and thereby enhances the reliability of a product, compared to the conventional configuration.

As stated above, the lead frame of the illustrative embodiment includes the plastically deformable portions 15. A photocoupler using such a lead frame is produced by a procedure including a lead forming step or crushing and bending step and a step of forming the reinforcing portions 23 around the deformable portions 15. More specifically, in the inner lead forming step following the primary sealing step, portions formed of an easy-to-deform material and provided with an easy-to-deform configuration are formed between the lead frame and the product portions beforehand, so that the positional relation between the former and the latter does not vary. The above portions deform to prevent deformation from being transferred to the frame.

Further, the reinforcing portions 23 protect the product portions from deformation in subsequent stages (particularly the deburring stage) ascribable to the deformable portions 15 that would otherwise reduce the strength of the product portions. This successfully reduces a mounting area to be allocated to, e.g., a double sealed photocoupler. In addition, deformation ascribable to lead forming is not transferred to the lead frame, so that the positioning holes 16 and product portions are maintained in the preselected positional relation. The reduction of deformation from about 0.223 to about 0.07 mm, i.e., by about one-third is particularly significant. Considering the state-of-the-art lead frame as thin as about 0.2 mm, a displacement of about 0.2 mm would result in the loss of the secondary seal resin for intercepting light.

Moreover, the deformable portions 15 compensate for some bend of the portions where the product forming portions and lead frame join each other. In addition, the lead frame is scarcely pulled during lead forming because only one of the element loading portions is bent upward above the associated leads. This is also successful to maintain the preselected positional relation between the product forming portions and the lead frame; otherwise the holes 16 would be displaced and make the following steps impracticable.

In the illustrative embodiment, the frame 10c has the lead frames 10a and 10b combined together with the former overlying the latter. Alternatively, the lead frames 10a and 10b may be shifted in the horizontal direction and constructed integrally with each other with the frames 11a and 11b thereof not overlapping each other.

Figure 14:
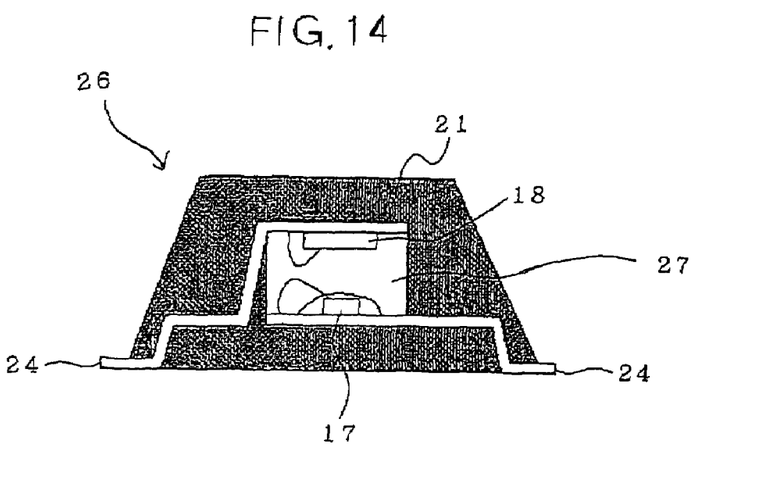
FIG. 14 is a section showing a W type photocoupler to which the present invention is similarly applicable.

FIG. 14 shows a specific W type photocoupler to which the present invention is similarly applicable. As shown, the W type photocoupler, labeled 26, includes liquid seal resin 27 in place of the primary molding in order to form an optical path.

In summary, in accordance with the present invention, a lead frame includes a plurality of tie bars including tie bars each having deformable portions that protect outside frames from deformation. The outside frames are formed with positioning holes. Element loading portions to be loaded with semiconductor elements are connected to the outside frames by such tie bars. The lead frame is therefore free from deformation during lead forming while promoting the miniaturization of the semiconductor devices.

Various modifications will become possible for those skilled in the art after receiving the teachings of the present disclosure without departing from the scope thereof.

What is claimed is:

1. A lead frame comprising:
   a tie bar to which an element loading portion to be loaded with a semiconductor element is connected by a lead forming portion;
   an outside frame formed with positioning holes, said tie bar being connected to said outside frame; and
   a deformable portion included in said tie bar for preventing said outside frame from deforming under extraneous physical stress,
   the deformable portion comprising a locally thinned portion,
   wherein said locally thinned portion comprises a rod portion smaller in width than the tie bar and is configured to deform during lead forming, which bends said lead forming portion, to thereby absorb stress acting on said tie bar.

2. A lead frame comprising:
a tie bar to which an element loading portion to be loaded with a semiconductor element is connected by a lead forming portion;
an outside frame formed with positioning holes, said tie bar being connected to said outside frame; and
a deformable portion included in said tie bar for preventing said outside frame from deforming under extraneous physical stress,
the deformable portion comprising a locally thinned portion,
wherein said locally thinned portion comprises a link connecting said tie bar to said outside frame, said link having two end portions and an intermediate portion, a diameter of the intermediate portion being smaller than a diameter of either of said two end portions, the link configured to absorb a force pulling said tie bar toward said element loading portion.

3. A lead frame comprising:
a tie bar to which an element loading portion to be loaded with a semiconductor element is connected by a lead forming portion;
an outside frame formed with positioning holes, said tie bar being connected to said outside frame; and
a deformable portion included in said tie bar for preventing said outside frame from deforming under extraneous physical stress,
the deformable portion comprising a locally thinned portion,
wherein said locally thinned portion comprises a link connecting said tie bar to said outside frame, said link having deformable shape in a form of narrow steps.

4. A frame comprising a combination of lead frames arranged such that element loading portions to be loaded with semiconductor elements thereof are positioned one above the other, said lead frames each comprising:
a tie bar to which the element loading portions are connected by lead forming portions;
an outside frame formed with positioning holes, said tie bar being connected to said outside frame; and
a deformable portion included in said tie bar for preventing said outside frame from deforming under physical stress,
the deformable portion comprising a locally thinned portion, wherein,
the element loading portions of only one of the lead frames are bent relative to lead forming portions associated therewith, and
said deformable portion is sealed with resin to thereby form a reinforcing portion that prevents said deformable portion from deforming after lead forming.

5. A frame comprising a combination of lead frames arranged such that element loading portions to be loaded with semiconductor elements thereof are positioned one above the other, said lead frames each comprising:
a tie bar to which the element loading portions are connected by lead forming portions;
an outside frame formed with positioning holes, said tie bar being connected to said outside frame; and
a deformable portion included in said tie bar for preventing said outside frame from deforming under physical stress,
the deformable portion comprising a locally thinned portion, wherein,
the element loading portions of only one of the lead frames are bent relative to lead forming portions associated therewith, and
the lead forming portions are bent while being crushed to be locally thinned and extended.

6. The frame as claimed in claim 5, wherein said reinforcing portion includes said deformable portion and a portion of said outside frame to which said deformable portion is connected.

7. The frame as claimed in claim 6, wherein said deformable portion prevents the positioning holes and the element loading portions from being displaced to thereby maintain a preselected positional relation between said positioning holes and said element loading portions.

8. A semiconductor device comprising:
a pair of element loading portions loaded with semiconductor elements and positioned one above the other within a light-transmitting resin,
seal resin sealing said pair of element loading portions within the light-transmitting resin,
leads connected to a respective semiconductor element being exposed on said seal resin, and
a photocoupler comprising a light-emitting element and a light-sensitive element that face each other,
wherein one of said pair of element loading portions is an unbent element loading portion unbent within the light-transmitting resin,
wherein said light-emitting element is loaded on the unbent element loading portion within said light-transmitting resin, and
wherein said unbent element loading portion is positioned below a bent element loading portion.

9. The semiconductor device as claimed in claim 8,
wherein the leads are implemented by lead forming portions included in a frame used to form semiconductor devices, said frame comprising a combination of lead frames each comprising:
a tie bar to which the element loading portions are connected by lead forming portion;
an outside frame formed with positioning holes, said tie bar being connected to said outside frame; and
a deformable portion included in said tie bar for protecting said outside frame from deforming.

10. A lead frame comprising:
a tie bar to which an element loading portion to be loaded with a semiconductor element is connected by a lead forming portion;
an outside frame formed with positioning holes, said tie bar being connected to said outside frame; and
a deformable portion included in said tie bar for preventing said outside frame from deforming under extraneous physical stress,
wherein said deformable portion comprises a link connecting said tie bar to said outside frame, said link comprising plural adjacent and spaced apart deformable elements.

11. A lead frame comprising:
a tie bar to which an element loading portion to be loaded with a semiconductor element is connected by a lead forming portion;
an outside frame formed with positioning holes, said tie bar being connected to said outside frame; and
a deformable portion included in said tie bar for preventing said outside frame from deforming under extraneous physical stress,
wherein the deformable portion comprises a deformable link connecting said tie bar to said outside frame, said link being deformable so as to absorb a force pulling said tie bar toward said element loading portions.

12. The lead frame of claim 11, wherein said link has a width smaller than a width of said tie bar.

13. A method of producing a semiconductor device by using a frame, said method comprising:
    bending lead forming portions after primary sealing using lighttransmitting resin; and
    sealing deformable portions included in a lead frame after said bending,
    wherein said bending comprises bending the lead forming portions while crushing said lead forming portions to thereby locally thin and extend said lead forming portions.

14. A method of producing a semiconductor device by using a frame, said method comprising:
    bending lead forming portions after primary sealing using light-transmitting resin; and
    sealing deformable portions included in a lead frame after said bending,
    wherein said frame comprises a combination of lead frames each comprising:
    a tie bar to which element loading portions are connected by lead forming portions;
    an outside frame formed with positioning holes, said tie bar being connected to said outside frame; and
    a deformable portion included in said tie bar for protecting said outside frame from deforming.

* * * * *